United States Patent
Kim et al.

(10) Patent No.: US 12,498,642 B2
(45) Date of Patent: Dec. 16, 2025

(54) EDGE EXPOSURE APPARATUS AND LIGHT SOURCE OUTPUT CONTROL METHOD

(71) Applicant: SEMES CO., LTD., Cheonan-si (KR)

(72) Inventors: Kwang Ryul Kim, Suwon-si (KR); Gil Soo Eun, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 877 days.

(21) Appl. No.: 17/752,721

(22) Filed: May 24, 2022

(65) Prior Publication Data

US 2022/0382164 A1    Dec. 1, 2022

(30) Foreign Application Priority Data

May 27, 2021    (KR) .......................... 10-2021-0068063

(51) Int. Cl.
*G03F 7/00*    (2006.01)

(52) U.S. Cl.
CPC ...... *G03F 7/70091* (2013.01); *G03F 7/70141* (2013.01)

(58) Field of Classification Search
CPC ............. G03F 7/70091; G03F 7/70141; G03F 7/2028; G03F 7/2022; G03F 7/70008; G03F 7/7055; G03F 7/70558; G03F 7/7085
USPC ................................. 430/30; 355/30, 53, 67
See application file for complete search history.

(56) References Cited

U.S. PATENT DOCUMENTS

| | | | | |
|---|---|---|---|---|
| 6,295,121 B1 * | 9/2001 | Nakamura | .......... | G03F 7/70858 355/53 |
| 10,754,254 B1 * | 8/2020 | Bai | .......................... | G03F 1/86 |
| 2001/0015795 A1 * | 8/2001 | Nishi | .................. | G03F 7/70933 430/311 |
| 2001/0043321 A1 * | 11/2001 | Nishi | .................. | G03F 7/70558 355/71 |

(Continued)

FOREIGN PATENT DOCUMENTS

| | | |
|---|---|---|
| CN | 104582218 A | 4/2015 |
| JP | 10261577 A | 9/1998 |

(Continued)

OTHER PUBLICATIONS

Won Cheol-hee, "Overview and Quality of UV Lamp," Journal of the Korean Institute of Illuminating and Electrical Installation Engineers, Dec. 1994, 8th vol. 6th Edition, p. 10(498)~21(509).

*Primary Examiner* — Caleen O Sullivan
(74) *Attorney, Agent, or Firm* — Procopio, Cory, Hargreaves & Savitch LLP

(57) ABSTRACT

The inventive concept provides an edge exposure apparatus for performing an edge exposing process by irradiating a light at an edge region of a substrate. The edge exposure apparatus includes a support unit configured to support the substrate; a light irradiation unit having a light source for irradiating the light on the substrate; and a control unit configured to control an output of the light source, and wherein the control unit comprises: a measurement unit configured to measure illuminance values according to the outputs of the light source; and an output control unit configured to set a reference illuminance value among the measured illuminance values by the measurement unit and to control the output of the light source based on the set reference illuminance value.

15 Claims, 6 Drawing Sheets

(56) References Cited

U.S. PATENT DOCUMENTS

| | | | | |
|---|---|---|---|---|
| 2004/0184015 A1* | 9/2004 | Kino | ................ | G03F 7/70883 |
| | | | | 356/399 |
| 2006/0033893 A1* | 2/2006 | Nakano | ............ | G03F 7/70933 |
| | | | | 355/53 |
| 2012/0002183 A1* | 1/2012 | Ota | ................ | G03F 7/70291 |
| | | | | 355/67 |
| 2014/0186755 A1* | 7/2014 | Sasaki | ............. | G03F 7/70558 |
| | | | | 430/30 |
| 2015/0103322 A1 | 4/2015 | Nakagomi et al. | | |

FOREIGN PATENT DOCUMENTS

| | | | |
|---|---|---|---|
| JP | 2002208559 A | 7/2002 | |
| JP | 2009224377 A | 10/2009 | |
| KR | 1020020055492 A | 7/2002 | |
| KR | 1020060013245 A | 2/2006 | |
| KR | 1020200026303 A | 3/2020 | |

\* cited by examiner

Before Using

After Using 6100 Hours

EDGE EXPOSURE APPARATUS AND LIGHT SOURCE OUTPUT CONTROL METHOD

CROSS-REFERENCE TO RELATED APPLICATIONS

A claim for priority under 35 U.S.C. § 119 is made to Korean Patent Application No. 10-2021-0068063 filed on May 27, 2021, in the Korean Intellectual Property Office, the entire contents of which are hereby incorporated by reference.

TECHNICAL FIELD

Embodiments of the inventive concept described herein relate to an edge exposure apparatus and a light source output control method.

BACKGROUND

A flat panel display (FPD) such as a liquid crystal display (LCD) device, a plasma display panel (PDP) device, and the like are widely used as an image display device.

The manufacturing of the FFD includes various processes including forming various patterns on a substrate (e.g., wafer), forming cells, modules, etc. In particular, a photolithography process is performed to form various patterns on the substrate. The photolithography process sequentially performs an application process of applying a photosensitive liquid such as a photoresist liquid on the substrate, an exposing process of exposing coated photosensitive film using a photomask defining pattern to be formed, and a developing process of selectively removing portions of the coated photoresist film. Herein, a baking process for heat-treating the substrate is performed before and/or after the application process and the developing process. Before the developing process, an edge exposing process is separately performed to expose a predetermined width of edge of the substrate. Hereinafter, a unit for performing the edge exposing process may be referred to as an EEW unit.

FIG. 1 is a view illustrating an embodiment of a conventional EEW unit.

An edge exposure wafer (EEW) unit used in a photo equipment is a unit that exposes an edge part of a wafer by irradiating a UV using an ArF, a KrF, an i-line, or the like. Referring to FIG. 1, the EEW includes a lamp house having a light source (a short arc lamp such as a high-pressure mercury lamp, a high-pressure xenon lamp, or the like) for applying exposing energy, an optical system for irradiating a predetermined area of the wafer surface, and an optional light guide for transferring a light energy of the lamp house to the optical system. Referring to FIG. 1, the lamp house may include a lamp, an elliptical reflector for condensing the light energy of the lamp, a shutter and an aperture for physically controlling the light energy of the lamp, and a controller unit for controlling a power or the like. The lamp used in the lamp house is a high-pressure mercury lamp or a xenon lamp, and the power used is 200 W to 250 W. These lamps are fixedly operated at a maximum power (rated power) of each power used, with the life of the 250 W lamp ranging from 1000 to 3000 hours and the life of 200 W lamp ranging from 1000 to 4000 hours.

The conventional operation of the conventional EEW lamps is to maintain the maximum power (rated power) at an initial stage, and then gradually decrease the luminance intensity, which may shorten the lamp life.

SUMMARY

Embodiments of the inventive concept provide a light source output control method capable of increasing a life of a light source in an edge exposure apparatus.

The technical objectives of the inventive concept are not limited to the above-mentioned ones, and the other unmentioned technical objects will become apparent to those skilled in the art from the following description.

The inventive concept provides a method for controlling an output of a light source for exposing a substrate for an edge exposure apparatus. The method includes measuring illuminance values according to output values of the light source; setting a reference illuminance value among the measured illuminance values; and controlling the output of the light source based on the reference illuminance value.

In an embodiment, the method further includes checking whether the set reference illuminance value satisfies an electrical stability.

In an embodiment, the checking whether the set reference illuminance value satisfies an electric stability includes checking whether an illuminance value percentage is 70% or above at the set reference illuminance value.

In an embodiment, the reference illuminance value is an illuminance value having the most close value to a target illuminance value needed for the exposing among the measured illuminance values.

In an embodiment, the method further includes measuring the output of the light source in real time.

In an embodiment, the method further includes controlling an aperture, when the output of the light source measured in real time deviates from an error range of the target illuminance value.

In an embodiment, the method further includes increasing the output of the light source, when the output of the light source measured in real time deviates from the error range of the target illuminance value even after the controlling the aperture.

In an embodiment, the increasing the output of the light source comprises increasing the output of the light source by the unit of 1 W.

In an embodiment, the method further includes furtherly increasing the output of the light source, when the output of the light source measured in real time deviates from the error range of the target illuminance value after the output of the light source is increased.

The inventive concept provides an edge exposure apparatus for performing an edge exposing process by irradiating a light to an edge region of a substrate. The edge exposure apparatus includes a support unit configured to support the substrate; a light irradiation unit having a light source for irradiating the light on the substrate; and a control unit configured to control an output of the light source, and wherein the control unit comprises: a measurement unit configured to measure illuminance values according to the outputs of the light source; and an output control unit configured to set a reference illuminance value among the measured illuminance values by the measurement unit and to control the output of the light source based on the set reference illuminance value.

In an embodiment, the output control unit checks whether the set reference illuminance value satisfies an electrical stability.

In an embodiment, the output control unit checks whether an illuminance value percentage is 70% or above at the set reference illuminance value.

In an embodiment, the reference illuminance value is an illuminance value having the most close value to a target illuminance value needed for an exposing among the measured illuminance values.

In an embodiment, the measurement unit measures in real time the outputs of the light source controlled according to the output control unit.

In an embodiment, the control unit further includes an aperture for physically adjusting the outputs of the light source.

In an embodiment, the output control unit controls the aperture, when the output of the light source measured in real time deviates from an error range of a target illuminance value.

In an embodiment, the output control unit increases the output of the light source, when the output of the light source measured in real time deviates from the error range of the target illuminance rate after the controlling the aperture.

In an embodiment, the output control unit increases the output of the light source by the unit of 1 W.

In an embodiment, the output control unit maintains the output of the light source, when the output of the light source measured in real time does not deviate from the error range of the target illuminance value after the output of the light source is increased.

In an embodiment, the output control unit furtherly increases the output of the light source, when the output of the light source measured in real time deviates from the error range of the target illuminance value after the output of the light source is increased.

According to an embodiment of the inventive concept, a life of a light source included in an edge exposure apparatus may be increased.

According to an embodiment of the inventive concept, an illuminance may be stabilized by lowering a heat generation temperature of a light source included in an edge exposure apparatus.

The effects of the inventive concept are not limited to the above-mentioned ones, and the other effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
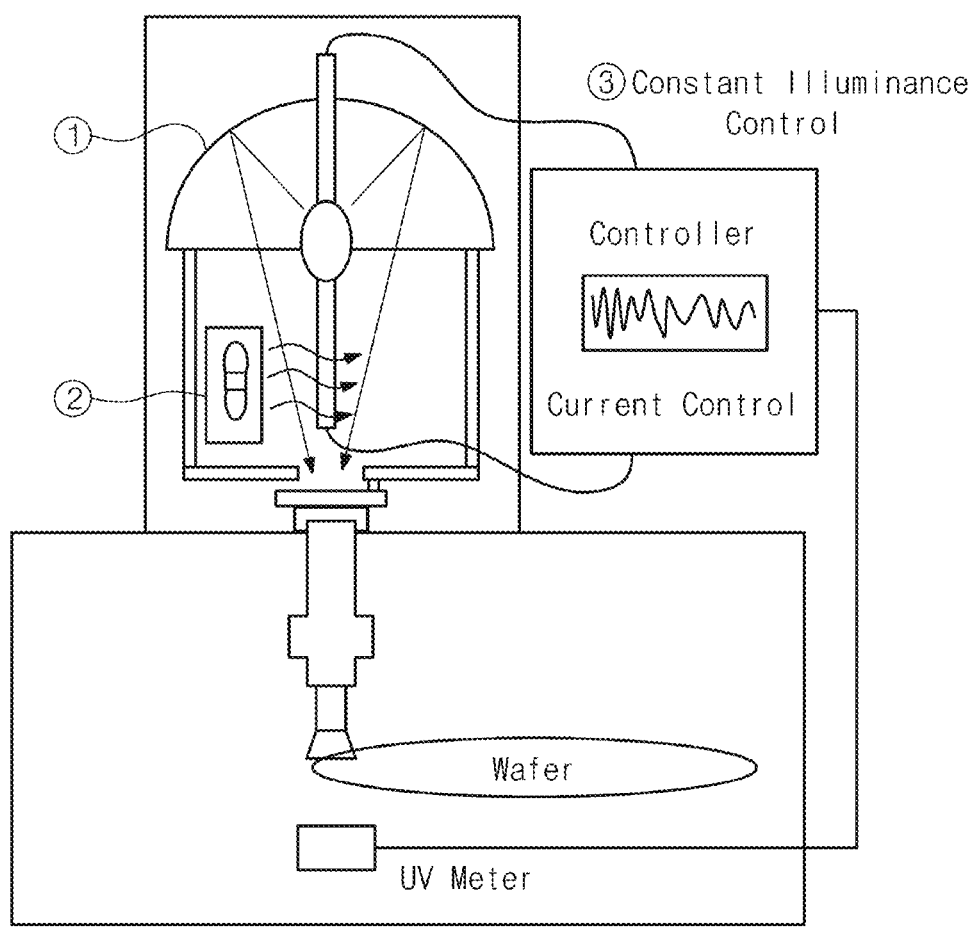
FIG. 1 is a view illustrating an embodiment of a conventional EEW unit.

The inventive concept may be variously modified and may have various forms, and specific embodiments thereof will be illustrated in the drawings and described in detail. The embodiment is provided to more fully explain the inventive concept to a person with average knowledge in the art. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear. Also, the same sign is used through the drawings for parts that have similar functions and actions.

The terminology used herein is for the purpose of describing particular embodiments only and is not intended to be limiting of the inventive concept. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof.

Singular expressions include plural expressions unless they are explicitly meant differently in context. In addition, the shapes and sizes of elements in the drawings may be exaggerated for clearer description.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Figure 2:
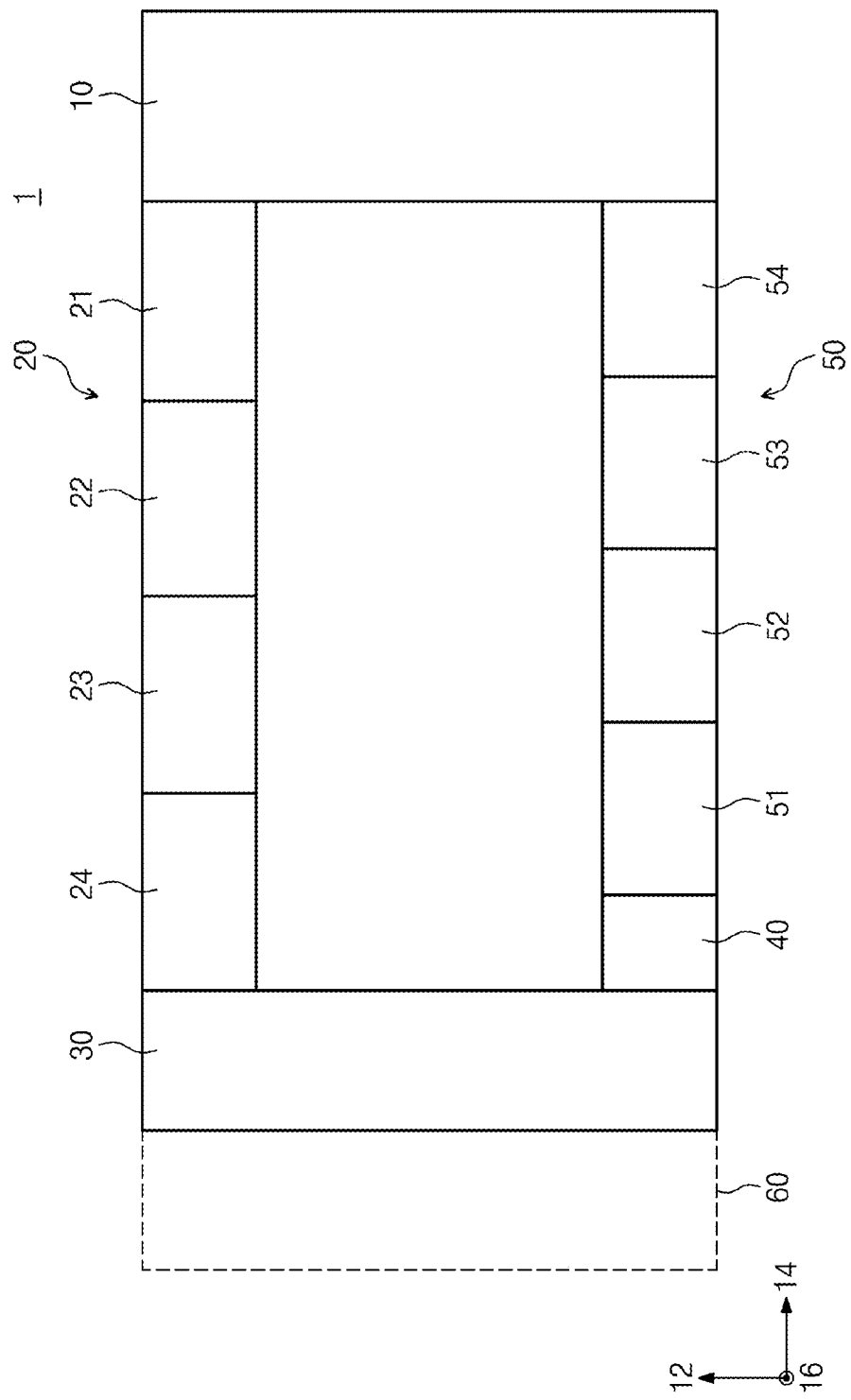
FIG. 2 illustrates a substrate treating apparatus according to an embodiment of the inventive concept.

FIG. 2 schematically illustrates a plan view of a substrate treating apparatus according to an embodiment of the inventive concept.

Referring to this, the substrate treating apparatus 1 includes an index module 10, an application module 20, an interface module 30, an edge exposure apparatus 40, and a developing module 50.

The index module 10 and the interface module 30 are disposed in parallel. The application module 20, the edge exposure apparatus 40, and the developing module 50 are disposed between the index module 10 and the interface module 30. The edge exposure apparatus 40 and the developing module 50 are adjacent and are disposed along the second direction 14. The application module 20 is disposed on opposite side in parallel with the edge exposure apparatus 40 and the developing module 50. The application module 20 is spaced apart from the edge exposure apparatus 40 and the developing module 50 along the first direction 12.

Through the index module 10, the substrate W is introduced into or discharged from the apparatus 1. In an embodiment, the index module 10 may be connected to a transport device the outside the apparatus 1. The transfer device may have a transfer roller. When the substrate W is introduced into the index module 10 from the outside, the substrate W may be introduced by the transfer roller carrying the substrate W. Likewise, when the substrate W is discharged to the outside, the substrate W may also be discharged by the transfer roller carrying the substrate W. Alternatively, a transfer robot may be disposed outside the index module 10. The transfer robot may transfer the substrate W to the index module 10 from the outside, or may transfer the substrate W that has been treated in the process from the index module 10 to the outside. The index module 10 is disposed with its lengthwise direction along the first direction 12.

The application module 20 performs an application process on the substrate W. The application module 20 is provided adjacent to a side of the index module 10. The application module 20 is disposed with its lengthwise direction along the second direction 14. The application module 20 includes a cleaning unit 21, a drying unit 22, an application unit 23, and a baking unit 24. In the application module 20, a cleaning process, a drying process, an application process, and a baking process are sequentially performed. The cleaning unit 21 cleans the substrate W before the application process of the substrate W is performed. The cleaning unit 21 supplies a cleaning liquid to the substrate W to perform a process. In an embodiment, the cleaning unit 21 may supply the cleaning liquid from a cleaning liquid supply means provided above the substrate W. For example, the cleaning liquid may include a deionized water.

The drying unit 22 dries the cleaning liquid remaining on the substrate W on which the cleaning process has been completed. In an embodiment, the drying unit 22 may include a fluid supply member that supplies an air above the substrate W to perform a drying process. In an embodiment, the fluid supply member may be provided as an air knife.

The application unit 23 performs an application process on the substrate W. In an embodiment, in the application process, a photosensitive liquid is applied to a top surface of the substrate W. The photosensitive liquid may be a photoresist liquid. The substrate W on which the application process has been completed moves to the baking unit 24. The baking unit 24 performs a baking process on the substrate W. In an embodiment, in the baking process, the substrate W may be heated by a heating means installed below the substrate W.

The substrate W on which the process is completed in the application module 20 moves to the interface module 30. The interface module 30 transfers the transferred substrate W to an exposure module 60 outside the apparatus 1. The substrate W on which the exposing process in the exposure module 60 outside the apparatus 1 is completed is transferred to the interface module 30 of the apparatus 1. The interface module 30 transfers the substrate W on which the exposing process has been completed to the edge exposure apparatus 40.

The interface module 30 is connected to the exposure module 60 The interface module 30 is disposed with its lengthwise direction along the first direction 12. When the substrate W is transferred by the interface module 30, the substrate W may be transferred using a transfer robot. The exposure module 60 outside the apparatus 1 performs the exposing process on the substrate W.

The developing module 50 performs a developing process on the substrate W. An index module 10 is disposed adjacent to a side of the developing module 50. The developing module 50 is parallel to the application module 20, and its lengthwise direction is disposed along the second direction 14.

The developing module 50 includes a developing unit 51, a rinsing unit 52, a drying unit 53, and an inspector 54. In the developing module 50, after the developing process at the developing unit 51, the cleaning process and the drying process are performed at the rinsing unit 52 and the drying unit 53, and then an inspection is performed at the inspector 54.

The edge exposure apparatus 40 performs an edge exposing process of irradiating a light to an edge of the substrate W. The edge exposure apparatus 40 is disposed between the interface module 30 and the developing module 50. In an embodiment, the edge exposing process may be performed after the exposing process. On the other hand, the edge exposure apparatus 40 may be disposed between the application module 20 and the interface module 30 to perform the edge exposing process after the application process.

Hereinafter, a configuration of the edge exposure apparatus 40 will be described in more detail with reference to the drawings.

Figure 3:
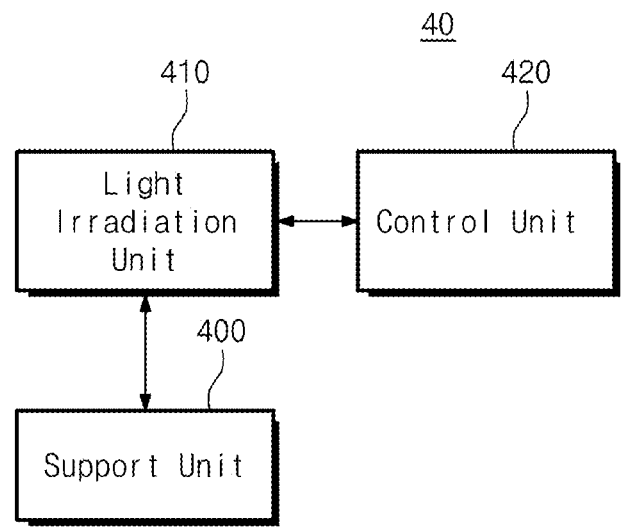
FIG. 3 is a block view illustrating a configuration of an edge exposure apparatus according to an embodiment of the inventive concept.

FIG. 3 is a block view illustrating a configuration of the edge exposure apparatus 40 according to an embodiment of the inventive concept.

Referring to FIG. 3, the edge exposure apparatus 40 according to the inventive concept may include a support unit 400, a light irradiation unit 410, and a control unit 420.

The support unit 400 may support a substrate to be exposed. The support unit 400 may be provided as an electrostatic chuck. The support unit 400 may support the substrate by a mechanical clamping method.

The light irradiation unit 410 may irradiate a light to the substrate W. The light irradiation unit 410 may irradiate the light to an edge of the substrate W. The light irradiation unit 410 may be positioned above the support unit 400. The light irradiation unit 410 may include a light source. According to an embodiment, the light source included in the light irradiation unit 410 may be a high-pressure mercury lamp. According to an embodiment, the light source included in the light irradiation unit 410 may be a high-pressure xenon lamp. According to an embodiment, the light source included in the light irradiation unit 410 may be a short arc lamp.

The control unit 420 may control an output of the light source included in the light irradiation unit 410. A more detailed configuration and control method of the control unit 420 will be described with reference to FIG. 4.

Figure 4:
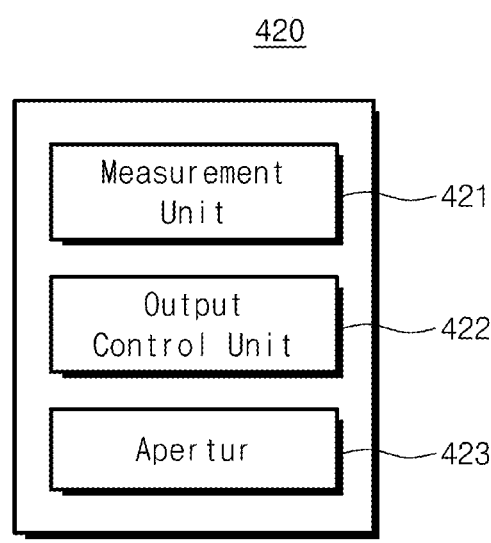
FIG. 4 is a block view illustrating a configuration of a control unit according to an embodiment of the inventive concept.

FIG. 4 is a block view illustrating a configuration of the control unit 420 according to an embodiment of the inventive concept. Referring to FIG. 4, the control unit 420 may include a measurement unit 421, an output control unit 422, and an aperture 423.

The measurement unit 421 may measure illuminance values (illuminance intensities) according to an output value of the light source included in the light irradiation unit 410. The measurement unit 421 may be a sensor capable of measuring the illuminance values. The measurement unit 421 may measure illumination values (illuminances) of a light output from the light source included in the light irradiation unit 410 in real time and may transmit the measured values to the output control unit 422.

The output control unit 422 may set a reference illuminance value among the illuminance values measured by the measurement unit 421 and may control the output of the light source included in the light irradiation unit 410 with an output value based on the reference illuminance value. In this case, the output control unit 422 may check whether the set reference illuminance value satisfies an electrical stability. In the inventive concept, the electrical stability is determined as satisfied when a percentage of the illuminance value at the set reference illuminance value is 70% or more.

The output control unit 422 according to the inventive concept may select and control an output value satisfying both the reference illuminance value and the electrical stability.

The reference illumination value selected by the output control unit 422 may be an illumination value having a value closest to a target illumination value required for an exposure among the illumination values measured by the measurement part unit 421. This will be described in detail through the following embodiments.

The aperture 423 can physically adjust the output of the light source.

When the output of the light source measured in real time through the measurement unit 421 deviates from a set error range of the target illuminance value, the output control unit 422 may perform an additional illuminance control using the aperture 423. The additional illuminance control using the aperture 423 may be performed without changing the output of the light source.

The output control unit 422 may increase and thereby control the output of the light source when the output of the light source measured in real time is out of an error range of the target illuminance value even after performing a controlling using the aperture 423. In this case, the output control unit 422 may control the output of the light source by increasing the output by the unit of 1 W. In this case, the error range may be around 5%. When determining the error range at this time, it may be applied only when it deviates below the target illuminance value. According to an embodiment, when both the conditions of the minimum power and the electrical stability are satisfied, an output much higher than the target illumination value may be derived, but when an error range is applied to this case, the controlling of the output may be not be done easily, so the error range may be applied only when the output is below the target illuminance.

The output control unit 422 may increase and control the output of the light source, and then maintain the output of the light source as it is when the output of the light source measured in real time does not deviate from the error range of the target illuminance value.

When the output of the light source measured in real time deviates from the error range of the target illuminance value after the output control unit 422 increases and controls the output of the light source, the output control unit 422 may additionally increase and control the output of the light source. In this case, the additional rising unit may be 1 W.

Hereinafter, a light source output control method according to the inventive concept will be described in more detail through experimental examples and embodiments.

In the method for controlling the constant illuminance according to the inventive concept, in order to determine a lower limit value of the light source, that is, a starting point (reference illuminance value) for controlling the constant illuminance, an illuminance value for each power must be measured for each light source in advance. This may be measured in advance or may be measured in real time through the measurement unit 421. This may be measured before an exposing in the edge exposure apparatus 40 proceeds.

Table 1 below shows measurements of the illuminance value (mW/cm$^2$) of a general 250 W mercury lamp house used in the EEW using a KrF. In the experiments in the table below, the illumination value was measured at 10 W intervals, but this is only an example, and the interval for measuring the illumination value may be greater than or less than 10 W.

TABLE 1

| 250 W Lamp Output (W) | Illumination Value (mW/cm$^2$) | Illumination Value Percentage |
|---|---|---|
| 250 | 591 | 100.0 |
| 240 | 553 | 93.6 |
| 230 | 530 | 89.7 |
| 220 | 476 | 80.5 |
| 210 | 457 | 77.3 |
| 200 | 427 | 72.3 |
| 190 | 403 | 68.2 |
| 180 | 385 | 65.1 |

[Illumination Value and Illumination Value Percentage According to 250 W Lamp Output]

It is assumed that the target illumination value required for the EEW exposing process is 400 mW/cm$^2$. In order to output the target illumination value of 400 mW/cm$^2$, an output capable of outputting an illumination value greater than the target illumination value should be selected as a minimum illumination control starting point. According to the table, 190 W capable of outputting an illuminance value of 403 mW/cm$^2$ may be a minimum illuminance control start point, that is, a reference illuminance value. In the inventive concept, a percentage of the illumination value is also considered for a lighting stability of the lamp. As a result of the experiment, it is confirmed that the electrical stability is high when the percentage of the illumination value is about 70% or more. Therefore, the output of the light source can be controlled by selecting an output value that can output the target illumination value (400 mW/cm$^2$) and satisfy the percentage of the illumination value (70% or more). According to the table, 200 W which satisfies both conditions may be set as a starting point for an illuminance control, that is, a reference illuminance value. In the case of the 250 W mercury lamp, it may be used by increasing it by 1 W to a maximum power (250 W) when the illumination value at the starting power decreases from 200 W, which is the starting output of the illumination control. At this time, the target illumination value may be 400 mW/cm$^2$, and the reference illumination value may be set to 403 mW/cm$^2$.

Table 2 below shows the measurements of the illuminance value (mW/cm$^2$) of a conventional 200 W mercury lamp house used in a semiconductor EEW and using a KrF.

TABLE 2

| 200 W Lamp Output (W) | Illumination Value (mW/cm$^2$) | Illumination Value Percentage |
|---|---|---|
| 200 | 2770 | 100 |
| 190 | 2605 | 94 |
| 180 | 2437 | 88 |
| 170 | 2261 | 82 |
| 160 | 2097 | 76 |
| 150 | 1930 | 70 |
| 140 | 1760 | 64 |
| 130 | 1600 | 58 |
| 120 | 1432 | 52 |
| 110 | 1266 | 46 |
| 100 | 1085 | 39 |
| 90 | 885 | 32 |
| 85 | 770 | 28 |

[Illumination Value and Illumination Value Percentage According to 200 W Lamp Output]

Herein, it is assumed that a target illuminance value required for the EEW exposure is 1200 mW/cm$^2$. In that case, 110 W exceeding the reference illuminance value may satisfy the condition that can be a starting point of the illuminance control. In the inventive concept, for the electrical stability of a lamp, the illuminance value percentage is also considered. As described above, it is confirmed by an experiment that the stability is high when the illuminance value percentage is 70% or more. That is, in 200 W, 150 to 160 W satisfying both conditions may be selected as a starting point for the illuminance control. In other words, 200 W mercury or xenon lamps can be operated at 150 W to 160 W initially and then increased by 1 W to increase the power up to a maximum 200 W. At this time, the target illumination value may be 1200 mW/cm$^2$, and the reference illumination value may be set to 1930 mW/cm$^2$.

When the present method is used, a heating temperature of the lamp is lowered, and thus the illumination is stabilized and the life of the lamp is extended, and it is confirmed through the experiment that the life of the lamp is extended. According to the conventional control method, the lamp has a life of 3000 hours, but it is confirmed through the experiment that the life of the lamp is more than 6000 hours when the constant illumination control is applied in the control method according to this invention.

Figure 5:
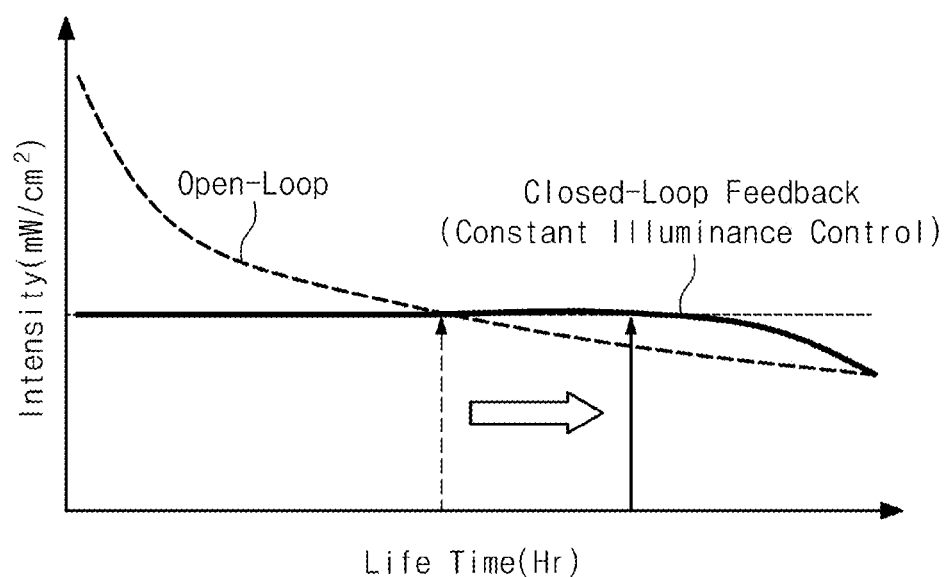
FIG. 5 is a result graph according to a conventional light source output control method and a light source output control method according to the inventive concept.

FIG. 5 is a result graph according to the conventional light source output control method and the light source output control method according to the inventive concept.

Referring to FIG. 5, the conventional light source output control method is indicated by an open loop, and the light source output control method in accordance with the inventive concept is indicated by a closed loop feedback.

Referring to FIG. 5, in the conventional light source output control method, the life is quickly exhausted by using a high power from the beginning, whereas in the control method according to the inventive concept, a closed loop feedback method is used. That is, when the control method according to the inventive concept is used, the power is lowered so as not to affect a normal operation from a beginning of a lamp lighting, and when the illuminance value is decreased, the power is increased step by step to finally reach the maximum power (rated power). When the present method is used, the heating temperature of the lamp is lowered, thereby stabilizing the illumination and lengthening the life of the lamp. In addition, by using the output control method according to the inventive concept, the illuminance value to be applied may be controlled to a predetermined constant value by adjusting the output of the light source, and thus, more stable than the conventional case where the illuminance value to be applied gradually decreases.

Figure 6:
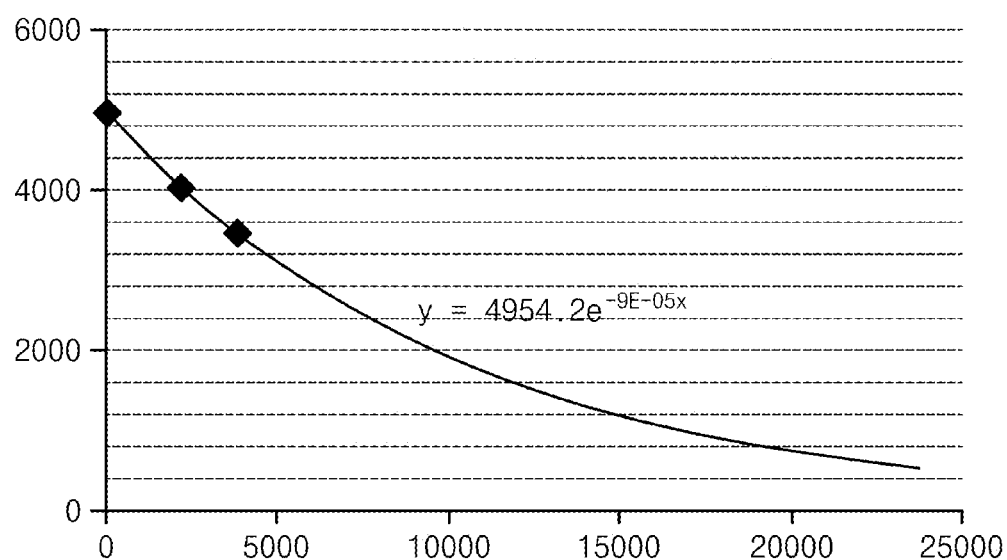
FIG. 6 is a graph of measuring a life using a control method according to the inventive concept.

FIG. 6 is a graph measuring a life using a control method according to the inventive concept.

Referring to FIG. 6, a lamp life can be predicted through a trend line using an exponential function. In FIG. 6, the horizontal axis represents time, and the vertical axis represents the illumination value. Referring to FIG. 6, it is expected to take about 15,000 hours that the illumination value is lowed to a reference illuminance value of 1200 mW/cm$^2$, but considering a degradation of a bulb made of quartz, the maximum life is determined to be about 6,000 hours. When using the constant illumination according to the inventive concept, it is possible to reach up to about 6000 hours, which is the maximum life of a 250 W mercury lamp. As a result of an actual evaluation, it is confirmed that the illuminance is 1986 mW/cm$^2$ at 6057 hours, and a sufficient illuminance value compared to the target illuminance value of 1200 mW/cm$^2$ can be ensured.

Figure 7:
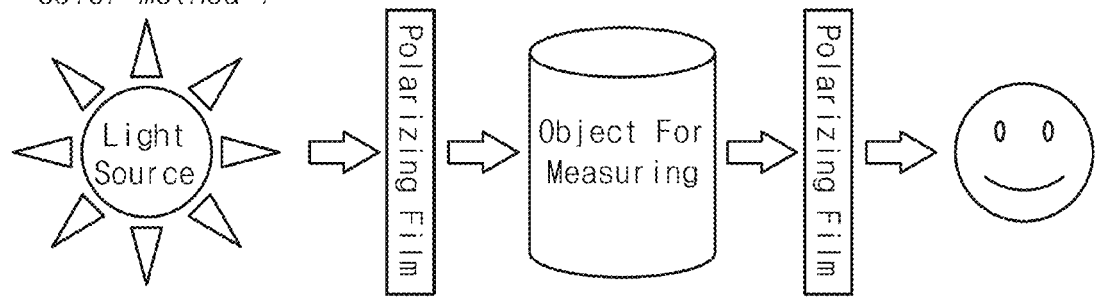
FIG. 7 illustrates a result of measuring the life using a sensitive color method.
Figure 7:
Figure 7:
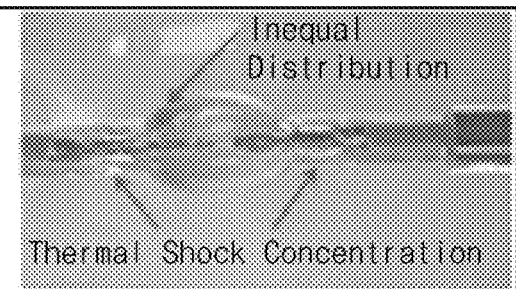

FIG. 7 illustrates a result of measuring a lifespan using a sensitive color method.

Referring to FIG. 7, a result of performing a state analysis of a lamp using 6100 hours is shown. As a result of analyzing a distribution of thermal shock of a lamp bulb using the sensitive color method, it was confirmed that it could be used safely for up to 6000 hours. In order to evaluate an effectiveness of a constant illuminance control, the life is increased by more than two times as a result of evaluating by applying an illuminance control algorithm of the inventive concept to a 250 W lamp house of the EEW module mounted on an actual track equipment.

Figure 8:
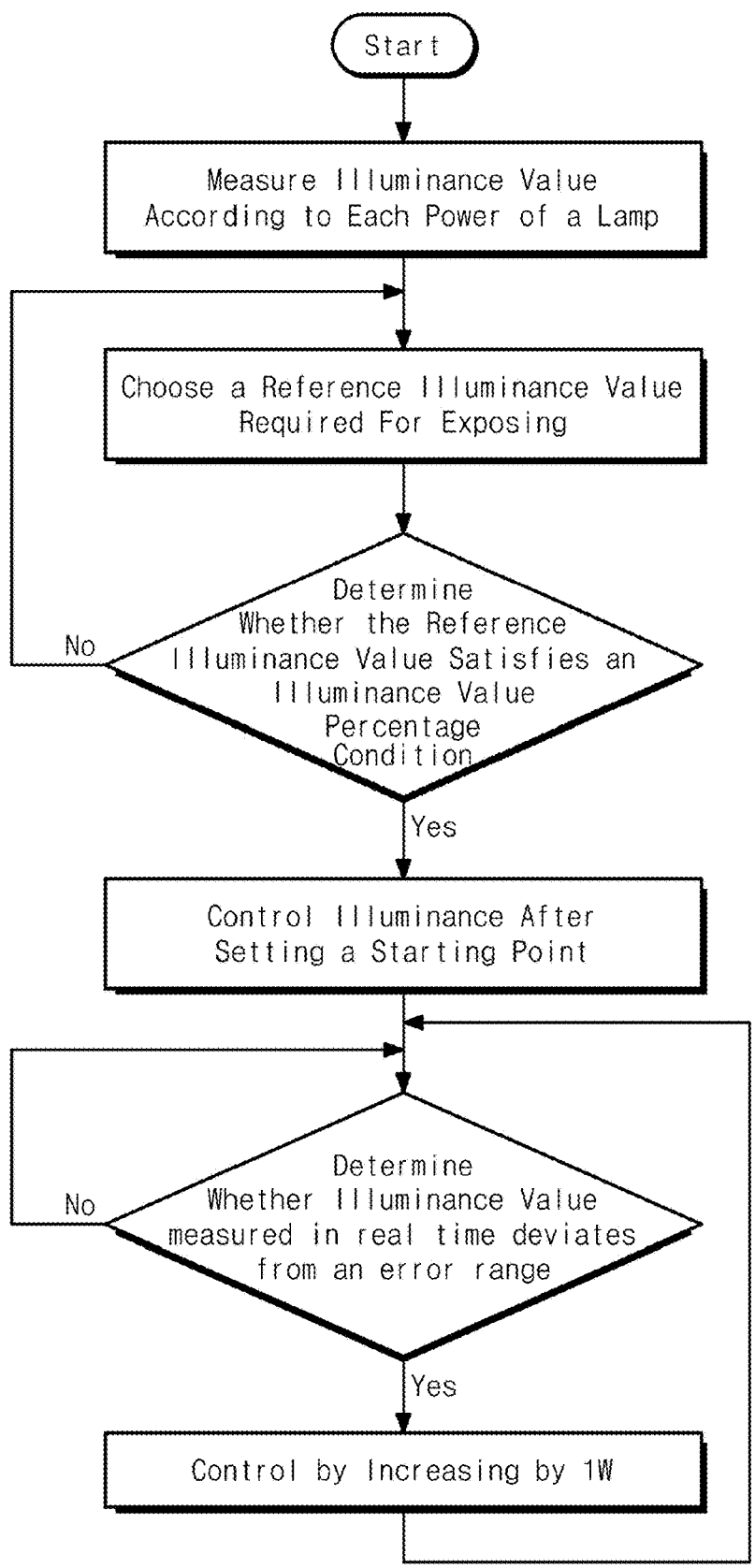
FIG. 8 is a flowchart illustrating an output control method according to an embodiment of the inventive concept.

FIG. 8 is a flowchart illustrating the output control method according to an embodiment of the inventive concept.

An illuminance control starting point (initial power) for controlling the constant illuminance according to the inventive concept may be determined by measuring the illuminance for each power value in each lamp. In this case, a power higher than the target illumination value required for the exposure should be selected, and the power should have illumination of 70% or more compared to the initial illumination value for the electrical stability of the lamp. If a power with a percentage of less than 70% of the initial illumination is selected, the lamp may be frequently turned off, and the electrical stability is very poor. After setting an illumination value satisfying both conditions as a starting point, the output of the lamp may be controlled. Thereafter, it is possible to check whether the illuminance value is out of an error range of the target illuminance value by measuring the illuminance values in real time. After that, if the illuminance value does not reach the target illuminance value, the illuminance can be controlled by increasing the output by 1 W. The power control is not performed when the maximum output is finally reached.

When performing the power control, a control of the aperture may be performed together when the illuminance value is less than the target illuminance value. According to an embodiment, the control using the aperture may be performed at a predetermined time period. If the illuminance value does not reach the target illuminance value even after the aperture is opened in full, it can be controlled by raising the output by 1 W outside the illuminance control range. Then, the illuminance can be measured again.

Referring to FIG. 8, a method for controlling the output of the light source for exposing the substrate in the edge exposure apparatus is disclosed.

According to the method, the illuminance value according to the output value of the light source may be measured. A measurement of the illuminance value may be measured in advance or in real time. The illuminance value according to the output value of the light source may be measured by adjusting the output value at regular intervals. The predetermined interval may be 10 W.

Among the illumination values measured by adjusting the output values at a predetermined interval, an illumination value which is closest to the target illuminance value may be set as a reference illuminance value, and the output of the light source may be controlled by the output value corresponding to the reference illuminance value. In this case, it is possible to check whether the set reference illuminance value satisfies the electrical stability. When the electrical stability is not satisfied, higher output value satisfying electrical stability may be selected and controlled.

When control is started, the output of the light source may be measured in real time. When the output of the light source measured in real time is out of the error range of the target illuminance value, a control through aperture may be performed. The illumination value can be controlled to be increased by completely opening the aperture. If the output of the light source measured in real time is out of the error range of the target illumination value even after the aperture control is performed, the output of the light source can be controlled by increasing it step by step. If the output of the light source measured in real time still deviates from the error range of the target illuminance after value is controlled by increasing and thereby controlling the output of the light source, the output of the light source may be furtherly increased and thereby controlled.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An edge exposure apparatus for performing an edge exposing process by irradiating a light to an edge region of a substrate, the edge exposure apparatus comprising:
   a support unit configured to support the substrate;
   a light irradiation unit having a light source for irradiating the light on the substrate; and
   a control unit configured to control an output of the light source, and
   wherein the control unit comprises:
      a measurement unit configured to measure illuminance values according to the outputs of the light source; and
      an output control unit configured to set a reference illuminance value among the measured illuminance values by the measurement unit and to control the output of the light source based on the set reference illuminance value, and
   wherein the edge exposure apparatus is configured to perform the edge exposing process after a main exposing process performed by an external exposure module.

2. The edge exposure apparatus of claim 1, wherein the output control unit checks whether the set reference illuminance value satisfies an electrical stability.

3. The edge exposure apparatus of claim 2, wherein the output control unit checks whether an illuminance value percentage is 70% or above at the set reference illuminance value.

4. The edge exposure apparatus of claim 3, wherein the output control unit is configured to reject reference illuminance values having an illuminance value percentage below 70% to prevent frequent lamp turn-off and maintain electrical stability.

5. The edge exposure apparatus of claim 1, wherein the reference illuminance value is an illuminance value having a most close value to a target illuminance value needed for an exposing among the measured illuminance values.

6. The edge exposure apparatus of claim 5, wherein the measurement unit measures in real time the outputs of the light source controlled according to the output control unit.

7. The edge exposure apparatus of claim 6, wherein the control unit further includes an aperture for physically adjusting the outputs of the light source.

8. The edge exposure apparatus of claim 7, wherein the output control unit controls the aperture, when the output of the light source measured in real time deviates from an error range of a target illuminance value.

9. The edge exposure apparatus of claim 7, wherein the aperture is configured to physically adjust the output of the light source without changing an electrical output of the light source.

10. The edge exposure apparatus of claim 8, wherein the output control unit increases the output of the light source, when the output of the light source measured in real time deviates from an error range of a target illuminance rate after the controlling the aperture.

11. The edge exposure apparatus of claim 10, wherein the output control unit increases the output of the light source by the unit of 1 W.

12. The edge exposure apparatus of claim 11, wherein the output control unit maintains the output of the light source, when the output of the light source measured in real time does not deviate from the error range of the target illuminance value after the output of the light source is increased.

13. The edge exposure apparatus of claim 12, wherein the output control unit furtherly increases the output of the light source, when the output of the light source measured in real time deviates from the error range of the target illuminance value after the output of the light source is increased.

14. The edge exposure apparatus of claim 1, wherein the light source is selected from the group consisting of a high-pressure mercury lamp, a high-pressure xenon lamp, and a short arc lamp.

15. An edge exposure apparatus for performing an edge exposing process by irradiating a light to an edge region of a substrate, the edge exposure apparatus comprising:
   a support unit configured to support the substrate;
   a light irradiation unit having a light source for irradiating the light on the substrate; and
   a control unit configured to control an output of the light source, and
   wherein the control unit comprises:
      a measurement unit configured to measure illuminance values according to the outputs of the light source; and
   an output control unit configured to set a reference illuminance value among the measured illuminance values by the measurement unit and to control the output of the light source based on the set reference illuminance value, and
   wherein the output control unit is configured to extend a life of the light source from 3000 hours to over 6000 hours through a constant illuminance control.

* * * * *